US008537348B2

(12) United States Patent
Jacobeen et al.

(10) Patent No.: US 8,537,348 B2
(45) Date of Patent: Sep. 17, 2013

(54) LIGHT EMITTING DIODE VERIFICATION SYSTEM

(75) Inventors: Brian Frank Jacobeen, Hummelstown, PA (US); Charles R. Gingrich, III, Mechanicsburg, PA (US); Wei Rong, Harrisburg, PA (US); Mohammad S. Ahmed, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 153 days.

(21) Appl. No.: 13/174,198

(22) Filed: Jun. 30, 2011

(65) Prior Publication Data

US 2013/0003051 A1 Jan. 3, 2013

(51) Int. Cl.
*G01J 1/42* (2006.01)

(52) U.S. Cl.
USPC .......................................................... 356/218

(58) Field of Classification Search
USPC .......................................................... 356/218
See application file for complete search history.

(56) References Cited

U.S. PATENT DOCUMENTS

| | | | |
|---|---|---|---|
| 7,850,334 B2 * | 12/2010 | Holder et al. | 362/227 |
| 7,942,556 B2 * | 5/2011 | Harbers et al. | 362/294 |
| 2005/0174808 A1 | 8/2005 | Butsch et al. | |

FOREIGN PATENT DOCUMENTS

| | | |
|---|---|---|
| DE | 19515865 A1 | 10/1996 |
| JP | 4095846 A | 3/1992 |

OTHER PUBLICATIONS

International Search Report, International Application No. PCT/US2012/044143, International Filing Date, Jun. 26, 2012.

* cited by examiner

*Primary Examiner* — Tu Nguyen

(57) ABSTRACT

A light emitting diode (LED) verification system is provided having a mounting module for securing an LED board for testing. The mounting module includes a thermal management system for controlling the temperature of the LED board. A mounting plate is provided for centering the LED board. A clamp is provided for securing the LED board. A hood is positioned over the mounting module. The hood has a top and a base. The mounting module is positioned at the base of the hood. The mounting plate centers the LED board with respect to a centerline of the hood. A light meter is positioned at the top of the hood and centered with respect to the centerline of the hood. The light meter measures light emitted from the LED board.

20 Claims, 8 Drawing Sheets

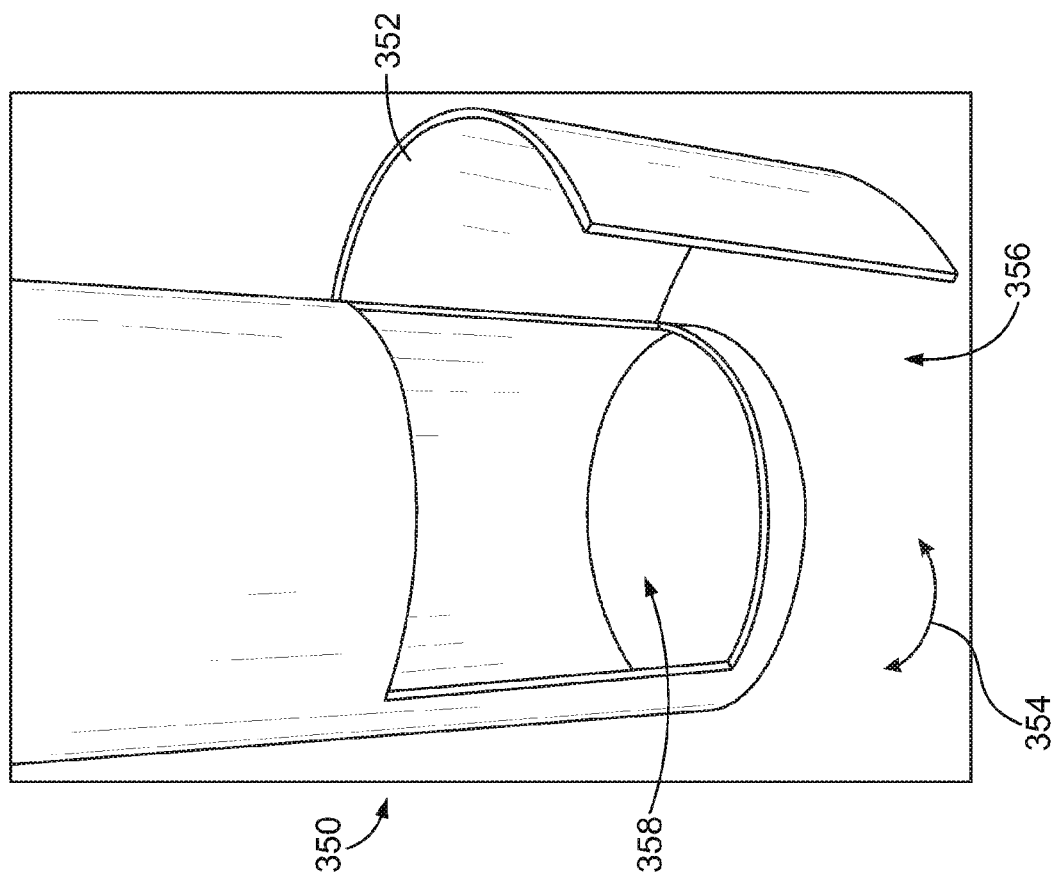
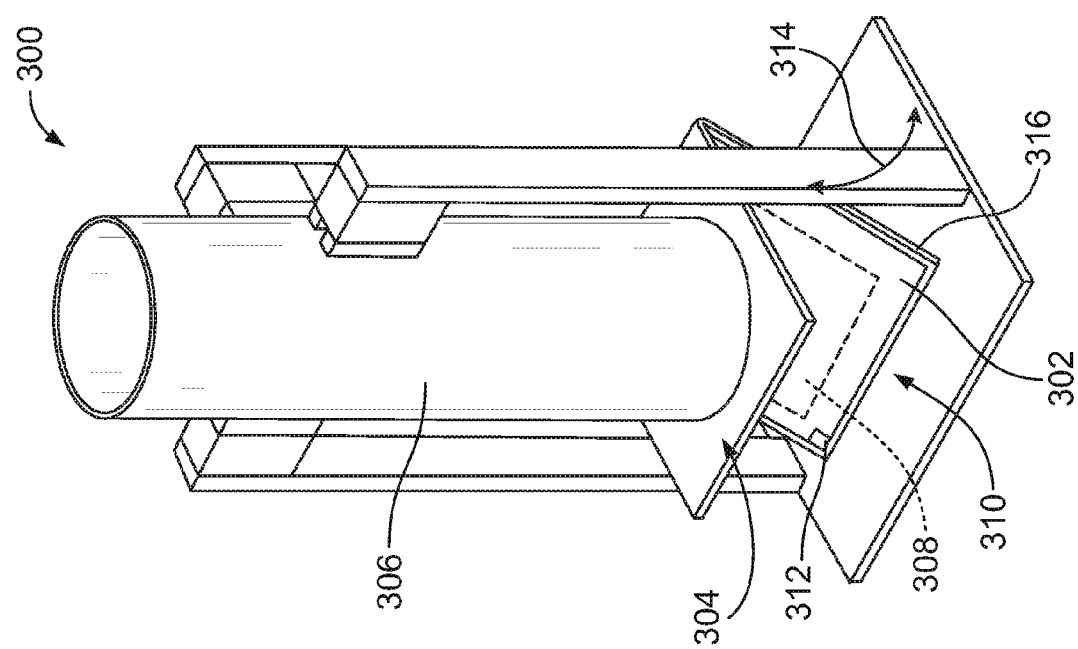

LIGHT EMITTING DIODE VERIFICATION SYSTEM

BACKGROUND OF THE INVENTION

The subject matter described herein relates, generally, to light emitting diodes (LEDs).

LEDs emit light when power (voltage and amperage) is applied. The amount of power required is based on the design of the LED. LEDs like other semiconductor devices are generally soldered to a circuit board from which power is then applied. Once assembled to a board the LED is commonly referred to as a LED module, a LED module can contain a single LED or multiple LEDs. It is in this assembled state the LED performance can be evaluated. For clarity the term LED will be used to represent LEDs and LED Modules.

Typically, the certification of an LED is performed in a laboratory setting. The equipment used is calibrated and certified to known standards. Once the LED design is certified, mass production of the LED can begin. As the production process typically involves the assembly of multiple untested components and involves processing through a soldering operation, testing of each assembled LED needs to be a part of the manufacturing process. The options for testing are to transport the LEDs to a testing facility, incorporate a testing laboratory in the manufacturing facility, test using a non-certified method or no testing. All these options have significant barriers to efficient manufacturing operations.

A need remains for a LED verification system capable of testing LED boards efficiently, to a certifiable standard and at the point of manufacture.

SUMMARY OF THE INVENTION

In one embodiment, a light emitting diode (LED) verification system is provided having a mounting module for securing a LED board for testing. The mounting module includes a thermal management system for controlling the temperature of the LED board. A mounting plate is provided for centering the LED board. A clamp is provided for securing the LED board. A hood defines a chamber positioned over the mounting module. The hood has a top and a base. The mounting module is positioned at the base of the hood. The mounting plate centers the LED board with respect to a centerline of the hood. A light meter is positioned at the top of the hood and centered with respect to the centerline of the hood. The light meter measures light emitted from the LED board.

In another embodiment, a light emitting diode (LED) verification system is provided having a hood extending between a top and a base. A chamber is defined by the hood. The chamber extends along a centerline between the top and the base. A light meter is positioned at the top. The light meter is centered with respect to the centerline. A LED board is positioned at the base and centered with respect to the centerline. The light meter is configured to detect light emitted from the LED board.

In another embodiment, a light emitting diode (LED) verification system is provided having a mounting module for securing a LED board for testing. The mounting module includes a mounting plate for centering the LED board. A clamp is provided for securing the LED board. A hood defines a chamber positioned over the mounting module. The hood has a top and a base. The mounting module is positioned at the base of the hood. A light meter is positioned at the top of the hood to measure light emitted from the LED board.

BRIEF DESCRIPTION OF THE DRAWING

The presently disclosed subject matter will be better understood from reading the following description of non-limiting embodiments, with reference to the attached drawings, wherein below:

FIG. 8 is a side perspective view of a LED verification system formed in accordance with another embodiment.

FIG. 9 is a side perspective view of a hood formed in accordance with another embodiment.

DETAILED DESCRIPTION OF THE INVENTION

Figure 1:
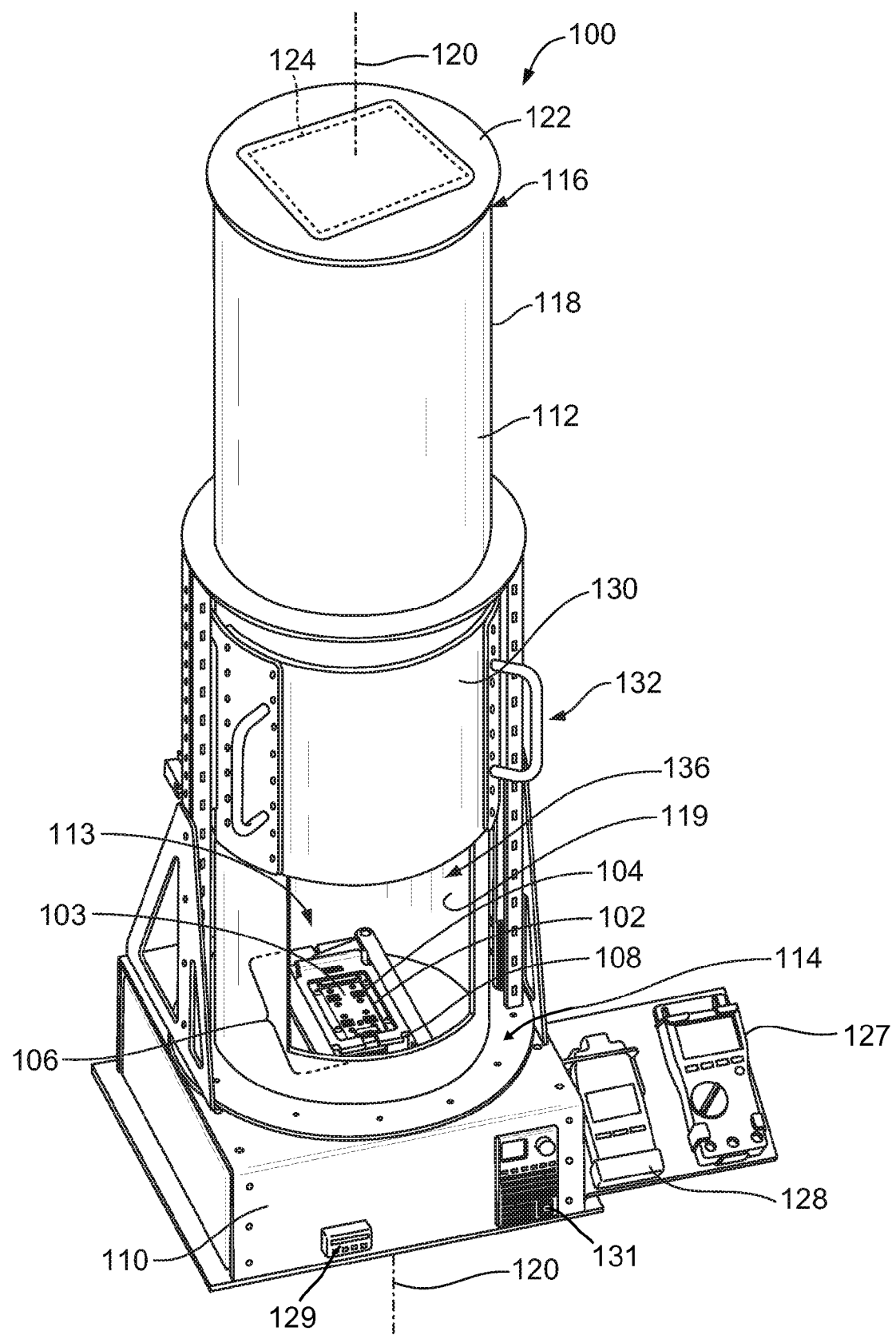
FIG. 1 is a side perspective view of a light emitting diode (LED) verification system formed in accordance with an embodiment and in an open position.

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Embodiments described herein provide a light emitting diode (LED) verification system designed for a manufacturing environment. The system requires minimal training and skills to operate, and produces measurements which can be correlated to existing light measurement technologies. The module also requires minimal floor space.

An integrating sphere may be used to measure luminous flux. The sphere captures the total flux from a LED module. An LED verification system inversely captures luminous flux from a specific zonal angle. The light captured at the specific zonal angle is directly proportional to a total luminous flux of the LED. Thus, the LED verification system can be calibrated to accurately measure the LED parameters.

An LED is a source that emits light in hemi-sphere space. The hemi-sphere space can be separated into different zones. A quantity of light called luminous flux, measured in lumens, goes through different zonal angles. The total luminous flux is the sum of the measured lumens at each zonal angle, as set forth in the equation:

$$\Phi_{total} = \sum_{r=0}^{90} \Phi_r$$

An integrating sphere is used to measure the luminous flux. The sphere captures the total flux from a LED module, which is $\Phi_{total}$. A relation between lumen F (unit lum or lm) and intensity I (cd) is expressed in the formula below:

$$F = \sum_i I_i(\theta) * \Delta\omega_i$$

Illuminance (measured in LUX) is defined as an amount of luminous flux per unit of area. An illuminance light meter measures illuminance at a certain distance. The light meter operates by capturing a certain amount of light ($F_\theta$) at a detector of a known area of the light meter. The light meter calculates the illuminance value ($E_\theta$) and displays it on a screen. Intensity (measured in candela) is the light emitted by a source in a specific direction. $I_\theta$ is the average intensity in the zonal angle $\Omega_\theta$, whose unit is candela (cd).

$F_\theta = I\Omega_\theta$ $\Omega_\theta = 2*\pi*(\cos(0°) - \cos(\theta))$

Therefore, $F_\theta = I\Omega_\theta = 2*\pi*(\cos(0°) - \cos(\theta))*I$, wherein $\theta$ is the 2d-plane angle.

The relationship between intensity I (unit is cd) and illuminance E (unit lux or lx) is defined by the formula below, where d=distance.

$E_\theta = I/d^2$ $F_\theta / \Phi_{total} = \eta$ wherein $\eta$ is a ratio of a percentage of light in zonal angle $\Omega$ compared to total lumen output, and $\eta$ is consistent of each LED.

Accordingly, an amount of light ($F_\theta$) that light meter captures is linearly correlated with total lumen output ($\Phi_{total}$) that the integrated sphere captures. The amount of light ($F_\theta$) that light meter captures is linearly correlated with illuminance ($E_\theta$) that the light meter shows. Therefore, the total luminous flux output ($\Phi_{total}$) that the integrating sphere captures is linearly correlated with illuminance ($E_\theta$) that the light meter shows. Accordingly, $E_\theta \propto I$ $F_\theta \propto I$ $F_\theta \propto E_\theta$ $F_\theta \propto \Phi_{total}$ Therefore, $E_\theta \propto \Phi_{total}$ An exemplary embodiment includes a light emitting diode (LED) verification system that is configured to test a LED board for pre-certification requirements. The LED board is secured to a mounting module having a thermal management system that is positioned over a cooling device for controlling a temperature of the LED board. A clamp secures the LED board to a mounting plate so that the LED board is held against the thermal management system to facilitate heat transfer between the LED board and the thermal management system. A hood is positioned over the mounting module so that the mounting module is positioned at the base of the hood. The LED board is centered within the hood. A light meter is positioned at the top of the hood and centered within the hood. The light meter is centered with respect to the LED board. The light meter measures light emitted from the LED board to test the LED board for pre-certification.

An exemplary embodiment includes a verification system designed to be a bench top system integrated into a LED manufacturing facility. The verification system cost may be at least 50% less than conventional systems. The verification system may also be designed to maximize manufacturability through put. In one embodiment, the verification system includes a hood coated inside with flat black paint. The hood is mounted in the vertical direction. A top of the hood includes an end cap configured to seal out external light. At the center of the end cap, a light meter is mounted inside the hood and centered within the hood. A detector surface of the light meter extends perpendicular to an axis or centerline of the hood and is aimed along the centerline of the hood.

In an exemplary embodiment, a base of the hood is mounted over a mounting module that may include a thermal management system. Optionally, a vapor chamber may be provided at the base of the hood for thermal management. A mounting plate is positioned on the heat sink to hold the LED boards being tested. A clamp provides a predetermined amount of force to the LED board to compress the LED board to the heat sink for thermal transfer. In one embodiment, a 24 V DC power supply may be used to power the thermal management system.

In an exemplary embodiment, a door or other access is provided in the hood to allow access to the mounting module for the installation and removal of the LED boards. The door may be designed to seal the hood from external light when closed.

In an exemplary embodiment, a power supply may be provided to power the LED board. The power supply may be a variable supply or fixed supply depending on a future application of the LED board. The verification system may include a circuit attached to the door which will power the LED board, when the access door is closed, and shut down power to the LED board, when the access door is open to protect an operator from intense LED light.

FIG. 1 is a side perspective view of a light emitting diode (LED) verification system 100 formed in accordance with an exemplary embodiment. The system 100 is configured for testing a LED board 102 having LEDs 104 positioned on a surface 103 thereof. For example, the system 100 may test various parameters of the LED board 102, for example, an output of the LED board 102, a temperature of the LED board 102, an input voltage of the LED board 102, an amperage of the LED board 102, and/or a light color of the LEDs 104. In one embodiment, the system may test luminance, whose units are in LUX or LX, of the LED board 102, wherein the LUX value is the energy density of the LEDs 104 in Candela per square meter. The system 100 may also test an x and y value of the LED board 102, wherein the x and y values represent the coordinates of the chromaticity chart (i.e. quality of color) of the LEDs 104. The system 100 may also test a luminance of the LEDs 104, wherein the luminance is a photometric measure of the luminous intensity per unit area of light travelling in a given direction. In one embodiment, the system 100 may test Correlated Color Temperature (CCT) measured in units K—Kelvin of the LED board 102. As will be appreciated, the system 100 may be configured to test other parameters of the LED board 102 and the LEDs 104.

The system 100 includes a mounting module 106 configured to secure the LED board 102. The mounting module 106 may include a clamp 108 configured to hold the LED board 102 in position on the mounting module 106. The mounting module 106 is positioned on a cooling device housed in the electrical enclosure 110. In one embodiment, the cooling device may be a heat sink, for example, a thermal electric heat sink. Alternatively, the cooling device may be a cooling block having cooling fluid (e.g. liquid and/or gas) flowing therethrough. The cooling block may be in fluid communication with a heat exchanger, refrigerant system, or the like. The cooling device may be an active cooling device, a passive cooling device, or the like. In one embodiment, the cooling device may include a fan or the like. The cooling device is configured to control a temperature of the LED board 102. For example, the cooling device may be configured to maintain a temperature of the LED board 102 at a steady-state temperature. The steady-state temperature desired for the LED board 102 may be pre-selected based on a power of the LED board 102, an intended application of the LED board 102, and/or other parameters related to a performance and certification of the LED board 102. In an exemplary embodiment, the clamp 108 holds the LED board 102 on the cooling device to enable heat transfer between the LED board 102 and the cooling device. For example, the clamp 108 may provide a uniform pressure on the LED board 102 to facilitate heat transfer between the LED board 102 and the cooling device. In one embodiment, the system 100 may also measure a temperature of the cooling device. In another embodiment, the system 100 displays a value of a LED power supply on a display 131.

A hood 112 is positioned over the mounting module 106. The hood 112 defines a chamber 113. In an exemplary embodiment, the hood 112 is cylindrical. The hood 112 includes a base 114 centered over the cooling device. The hood 112 extends between the base 114 and a top 116 and includes a centerline 120 extending therethrough. The hood 112 includes a sidewall 118 that defines the chamber 113. The sidewall 118 extends parallel to the centerline 120. An interior surface 119 of the sidewall 118 is configured to retain light within the hood 112. For example, the interior surface 119 of the sidewall 118 may be painted with a flat black paint that limits or prevents light from the LED board 102 from escaping from or reflecting within the hood 112, when the LED board 102 is in operation. The mounting module 106 is positioned within the chamber 113 and is generally centered with respect to the centerline 120 of the hood 112. The LED board 102 is retained by the mounting module 106 such that the LED board 102 is generally centered with respect to the centerline 120 of the hood 112. The LED board 102 is positioned within the chamber 113 such that the surface 103 of the LED board 102 extends substantially perpendicular to the centerline 120 and sidewall 118 of the hood 112.

The base 114 of the hood 112 is sealed to a top plate of the electrical enclosure 110. For example, a gasket or the like may extend along the base 114 of the hood 112. The base 114 is sealed to the top plate of the electrical enclosure 110 to limit and/or prevent outside light from entering the hood 112. The base 114 is also sealed to the top plate of the electrical enclosure 110 to limit and/or prevent light from the LED board 102 from escaping the hood 112, when the LED board 102 is in operation.

The top 116 of the hood 112 includes an end cap 122. The end cap 122 seals the top 116 of the hood 112 to limit and/or prevent outside light from entering the hood 112. The end cap 122 also seals the top 116 of the hood 112 to limit and/or prevent light from the LED board 102 from escaping the hood 112, when the LED board 102 is in operation. A light meter 124 (shown in phantom) is positioned on a bottom side 126 of the end cap 122 and inside the hood 112. The light meter 124 is configured to detect light emitted from the LED board 102 to test the various parameters of the LED board 102, as described above. The light meter 124 outputs data to a light meter display 128 and/or an electrical meter 127, which display the various data related to the various parameters of the LED board 102.

A door 130 is provided on the sidewall 118 of the hood 112. The door moves between an open position 132 (as illustrated) and a closed position 134 (shown in FIG. 2). In the open position 132, the door enables access to the mounting module 106 through an opening 136. Access to the mounting module 106 enables LED boards 102 to be inserted into and removed from the hood 112. Additionally, the door 130 also provides access for replacing components of the mounting module 106.

In one embodiment, the system 100 includes an automated system for the positioning and mounting the modules for testing. The system 100 may utilize pneumatic, electro-pneumatic or electro-mechanical devices which would position the modules for testing and align the hood, light meter and heat management system properly for testing.

Although the system 100 is illustrated in a vertical configuration, it should be noted that the system is operable in any configuration, for example, a horizontal configuration. Alternatively, the LED board 102 may be positioned at a top of the system 100 and the light meter 124 positioned at a bottom of the system 100.

Figure 2:
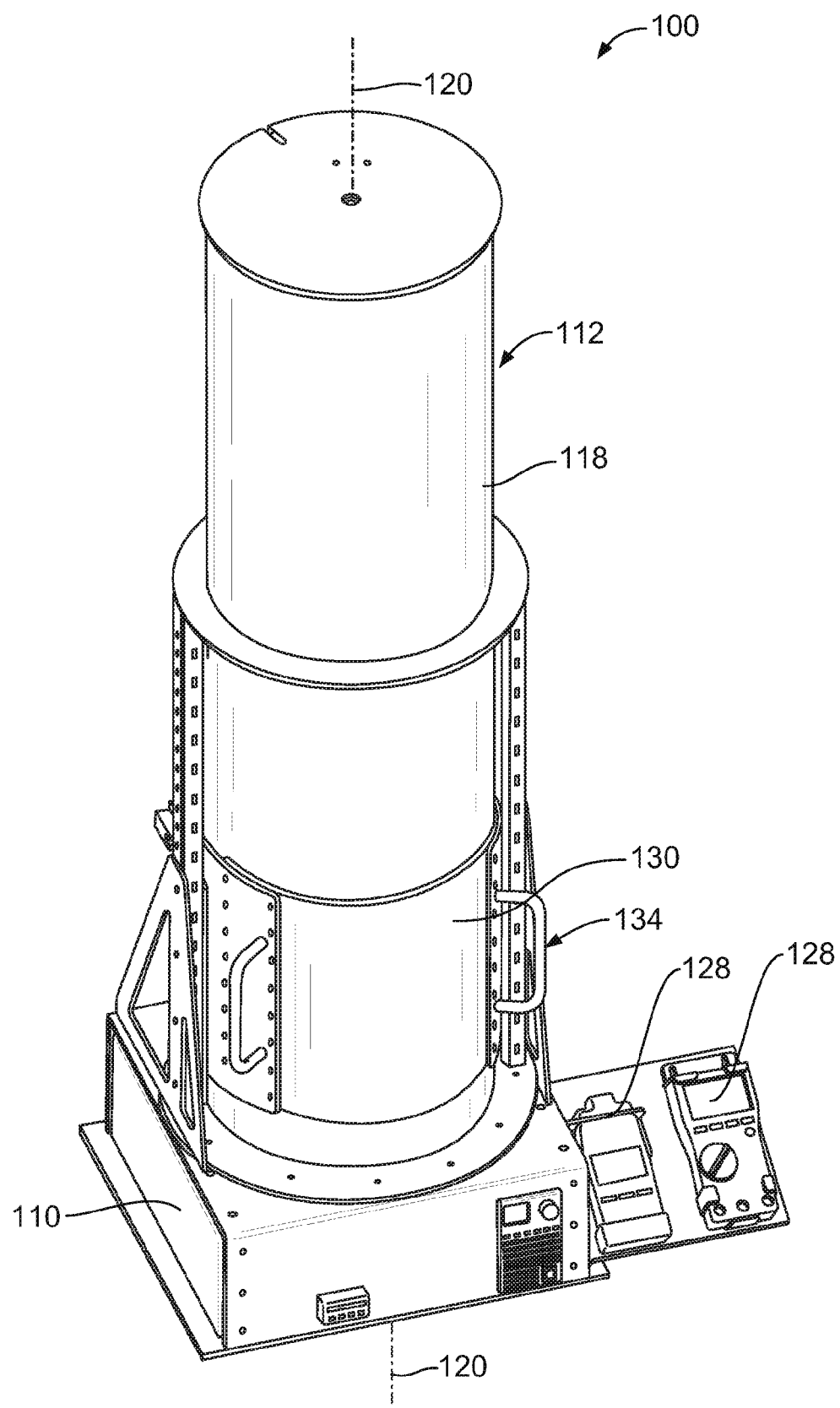
FIG. 2 is a side perspective view of the LED verification system shown in FIG. 1 and in a closed position.

FIG. 2 is a side perspective view of the LED verification system 100 having the door 130 in the closed position 134. In the closed position 134, the door 130 seals the opening 136. The door 130 seals to the sidewall 118 of the hood 112. The door 130 limits and/or prevents light from entering and/or escaping from the hood 112. In one embodiment, the door 130 may include a seal, for example, a gasket that facilitates sealing the opening 136.

During operation, the LED board 102 (shown in FIG. 1) is positioned within the chamber 113 on the mounting module 106. The LED board 102 is positioned such that the LED board 102 is generally centered with respect to the centerline 120 of the hood 112. The surface 103 of the LED board 102 extends substantially perpendicular with respect to both the centerline 120 and the sidewall 118 of the hood 112. The LED board 102 is connected to a power cable (not shown) to provide power thereto. Next, the door 130 is moved into the closed position 134 to seal the LED board 102 within the hood 112. The system 100 may include a circuit and/or switch (not shown) that is configured to power the LED board 102 through the power cable when the door 130 is moved to the closed position 134. If the door 130 is moved to the open position 132, the switch and/or circuit shuts off the power to the LED board 102 to protect an operator from potentially harmful light.

Once the LED board 102 is sealed within the chamber 113, the LED board 102 is powered to emit light from the LEDs 104 toward the light meter 124 (shown in FIG. 1). The light meter 124 measures the emitted light to generate data related to the parameters of the emitted light, as described above. The light meter 124 transmits the data to the light meter display 128 and/or an electrical meter 127 to display the data for an operator. In one embodiment, the system 100 may also collect data related to the cooling device, for example, a temperature of the cooling device. The data related to the cooling device may also be transmitted to the metering devices 129 mounted on the front panel for display.

Figure 3:
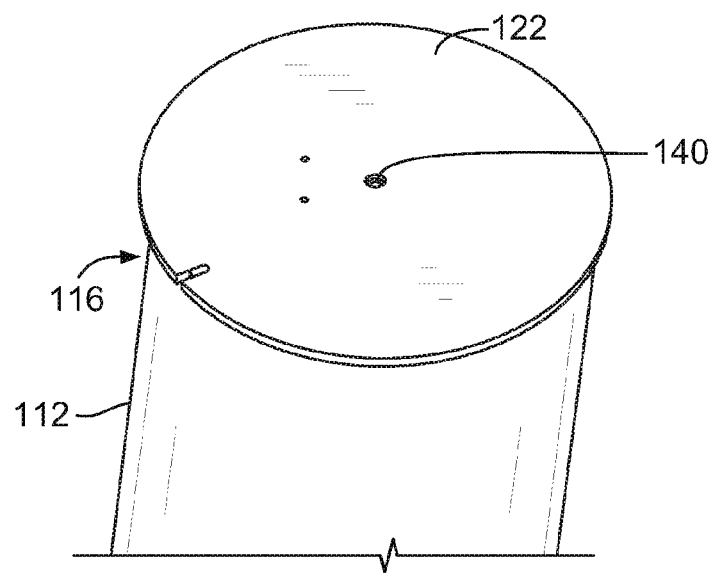
FIG. 3 is a top perspective view of the LED verification system shown in FIG. 1.

FIG. 3 is a top perspective view of the LED verification system 100. In particular, FIG. 3 illustrates the end cap 122 positioned on the top 116 of the hood 112. The end cap 122 seals the top 116 of the hood 112 to limit and/or prevent light from entering and/or escaping the hood 112. In one embodiment, the end cap 122 may be sealed to the top 116 of the hood 112, for example, with a gasket (not shown) to further limit and/or prevent light from entering or escaping the hood 112.

Figure 4:
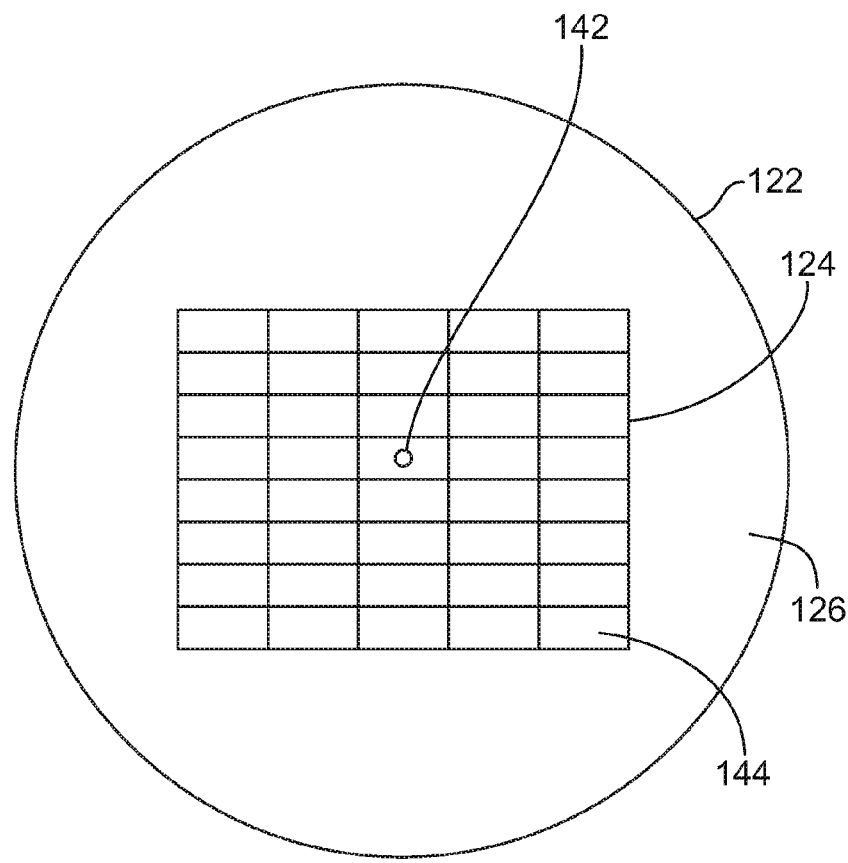
FIG. 4 is a bottom view of an end cap formed in accordance with an embodiment.

In an exemplary embodiment, the end cap 122 includes an opening 140 extending therethrough. The opening 140 is configured to receive wires (not shown) from a detector head of the light meter (shown in FIG. 1) positioned on the bottom side 126 of the end cap 122, as illustrated in FIG. 4. The wires may extend to the light meter display 128 (shown in FIGS. 1 and 2) and be configured to transmit data and/or power signals between the light meter display 128 and the light meter 124. Alternatively, the light meter 124 may be battery powered and/or configured to communicate with the light meter display 128 wirelessly. In such an embodiment, the end cap 122 may not include an opening 140 for wires. In one embodiment, the opening 140 is sealed around the wires, for example, with a gasket (not shown) to limit and/or prevent light from entering and/or escaping the hood 112.

FIG. 4 is a bottom view of the end cap 122. FIG. 4 illustrates a light meter detector head 125 of the light meter 124 positioned on the bottom side 126 of the end cap 122. The light meter detector head 125 may be generally centered with respect to a center 142 of the end cap 122. The center 142 of the end cap 122 is aligned with the centerline 120 (shown in FIGS. 1 and 2) of the hood 112 (shown in FIGS. 1-3), when the end cap 122 is sealed to the hood 112. As such, the light meter detector head 125 may be generally centered with respect to the centerline 120 of the hood 112. The light meter detector head 125 may also be generally centered with respect to the LED board 102 (shown in FIG. 1), when the LED board 102 is positioned within the chamber 113.

In the illustrated embodiment, the light meter detector head 125 includes a detector surface 144. The detector surface 144 is configured to receive light emitted from the LEDs 104 of the LED board 102 to provide data with respect to the parameters of the light, as discussed above. The detector surface 144 may extend substantially perpendicular to the centerline 120 and/or the sidewall 118 (shown in FIGS. 1 and 2) of the hood 112. In an exemplary embodiment, the detector surface 144 extends substantially parallel to the surface 103 (shown in FIG. 1) of the LED board 102.

Figure 5:
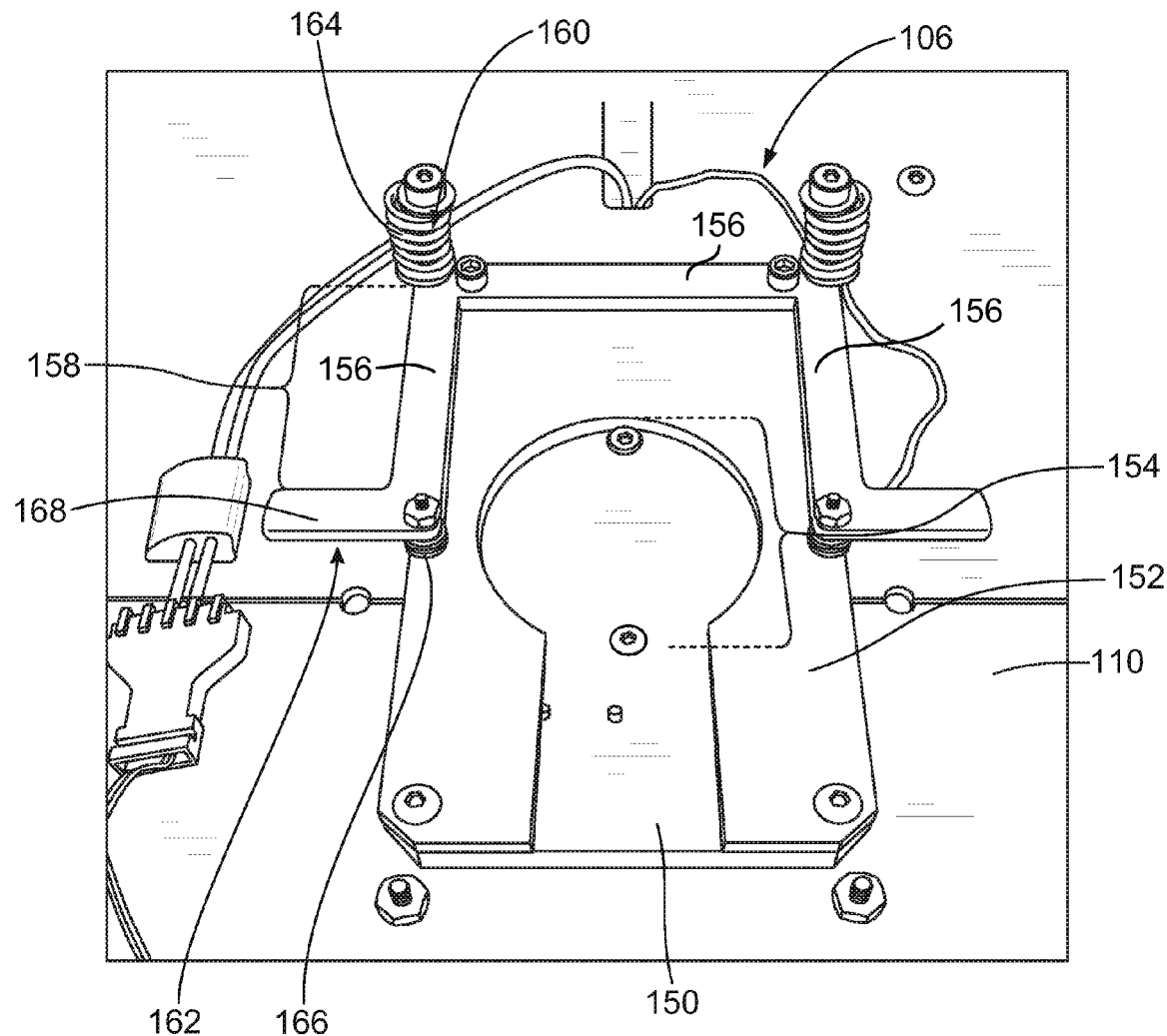
FIG. 5 is a top perspective view of a mounting module formed in accordance with an embodiment.

FIG. 5 is a top perspective view of a mounting module 148 that may be embodied as the mounting module 106 shown in FIG. 1. The mounting module 148 includes a thermal management system 150. The thermal management system 150 may be formed from copper and/or any other suitable material for heat transfer. The thermal management system 150 is positioned on the cooling device to facilitate heat transfer therebetween. A mounting plate 152 is positioned on the thermal management system 150. The mounting plate 152 may be configured to mount the LED board with respect to the centerline 120 of the hood 112 (both shown in FIG. 1). The mounting plate 152 may also be configured to position a surface, for example, the surface 103 (shown in FIG. 1) of the LED board with respect to the detector surface 144 of the light meter 124 (both shown in FIG. 4). The mounting plate 152 may be formed from aluminum. A mounting area 154 is formed in the mounting plate 152. The mounting area 154 is sized and shaped to receive a LED board, for example, the LED board 102 shown in FIG. 1. In the illustrated embodiment, the mounting area 154 is shaped to receive a circular LED board 102. In one embodiment, the mounting plate 152 may be interchangeable with other mounting plates 152 having mounting areas 154 sized and shaped for different LED boards 102.

The LED board 102 sits within the mounting area 154 on top of the thermal management system 150 to facilitate heat transfer between the LED board 102 and the thermal management system 150. The thermal management system 150 is positioned on the cooling device 110 to facilitate heat transfer between the LED board 102 and the cooling device. For example, the thermal management system 150 may be configured to control a temperature of the LED board. In one embodiment, the thermal management system 150 is positioned on the cooling device to maintain the temperature of the LED board 102 at or nearly at a steady-state temperature.

The mounting module 148 includes a clamp 156 to retain the LED board 102 on the mounting module 148. In an exemplary embodiment, the clamp 156 holds the LED board 102 against the thermal management system 150 to enable heat transfer between the LED board 102 and the thermal management system 150. The clamp 156 is configured to substantially evenly distribute pressure against the LED board 102 to facilitate even heat transfer between the LED board 102 and the thermal management system 150.

In the illustrated embodiment, the clamp 156 includes a pair of spring-loaded arms 158. The arms 158 include a fixed end 160 and a moveable end 162. The fixed end 160 includes a biasing member 164 (illustrated as a spring). As will be appreciated, the biasing member 164 may be any suitable biasing member 164. The biasing member 164 provides a downward force on the arm 158 to direct the moveable end 162 toward the thermal management system 150 and the mounting plate 152. The moveable end 162 is configured to be positioned along an edge of the LED board 102 to hold the LED board 102 against the thermal management system 150. A pad 166 is coupled to the moveable end 162 of the arm 158. The pad 166 is configured to be positioned on the LED board 102. A flange 168 extends from the moveable end 162 to provide a surface for gripping and moving the arm 158.

Figure 6:
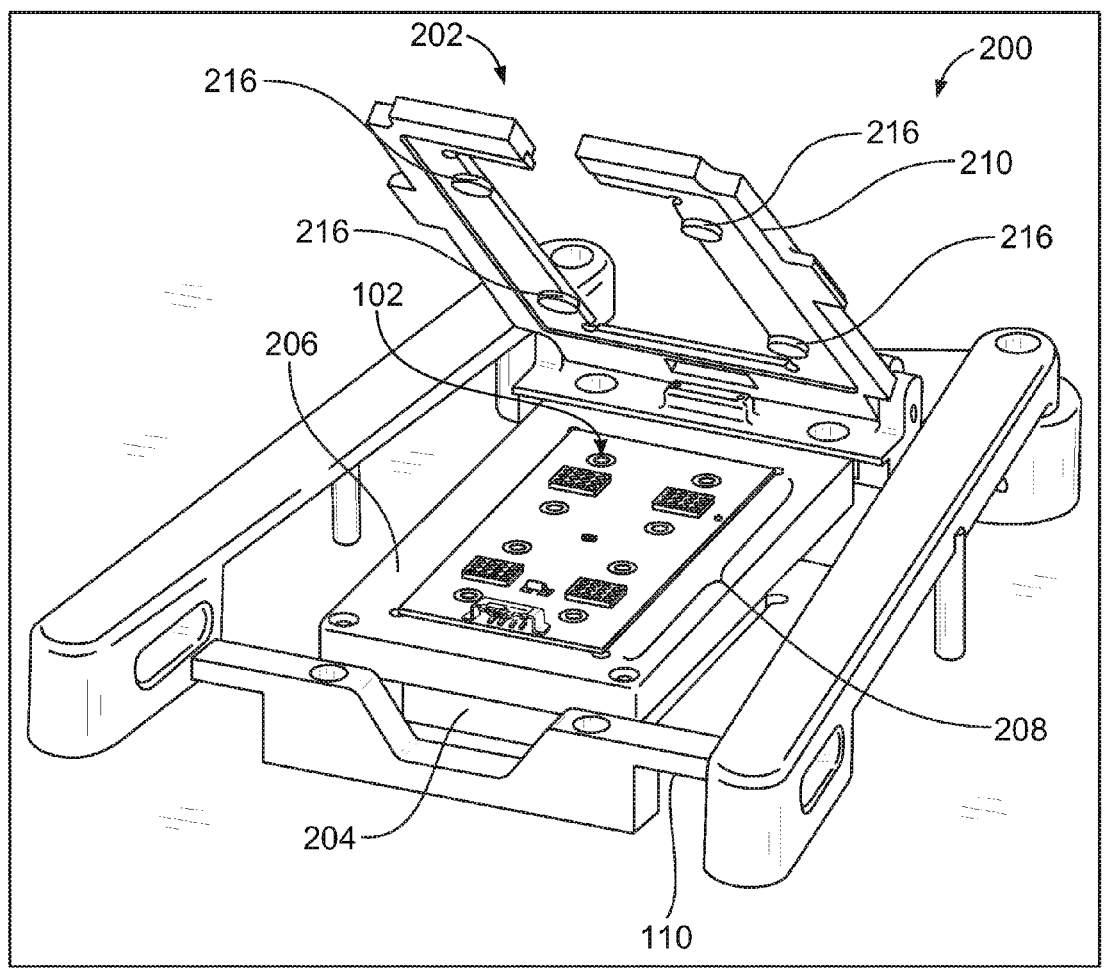
FIG. 6 is a top perspective view of a mounting module formed in accordance with another embodiment and in an open position.

FIG. 6 is a top perspective view of a mounting module 200 formed in accordance with another embodiment and in an open position 202. The mounting module 200 includes a thermal management system 204. The thermal management system 204 may be formed from copper and/or any other suitable material for heat transfer. The thermal management system 204 is positioned on the cooling device 110 to facilitate heat transfer therebetween. A mounting plate 206 is positioned on the thermal management system 204. The mounting plate 206 may be configured to mount the LED board 102 with respect to the centerline 120 of the hood 112 (both shown in FIG. 1). The mounting plate 206 may also be configured to position a surface, for example, the surface 103 (shown in FIG. 1) of the LED board 102 with respect to the detector surface 144 of the light meter 124 (both shown in FIG. 4). The mounting plate 206 may be formed from aluminum. A mounting area 208 is formed in the mounting plate 206. The mounting area 208 is sized and shaped to receive a LED board, for example, the LED board 102 shown in FIG. 1. In the illustrated embodiment, the mounting area 208 is shaped to receive a rectangular LED board 102. In one embodiment, the mounting plate 206 may be interchangeable with other mounting plates 206 having mounting areas 208 sized and shaped for different LED boards 102.

The LED board 102 sits within the mounting area 208 on top of the thermal management system 204 to facilitate heat transfer between the LED board 102 and the thermal management system 204. The thermal management system 204 is positioned on the cooling device 110 to facilitate heat transfer between the LED board 102 and the cooling device 110. For example, the thermal management system 204 may be configured to control a temperature of the LED board. In one embodiment, the thermal management system 204 is positioned on the cooling device 110 to maintain the temperature of the LED board 102 at or nearly at a steady-state temperature.

In the illustrated embodiment, the mounting module 200 includes a clamp 212. The clamp 210 moves between the open position 202 and a closed position 214 (shown in FIG. 7). The clamp 210 includes a plurality of pads 216 that are configured to be positioned against the LED board 102, when the clamp 210 is moved into the closed position 214.

Figure 7:
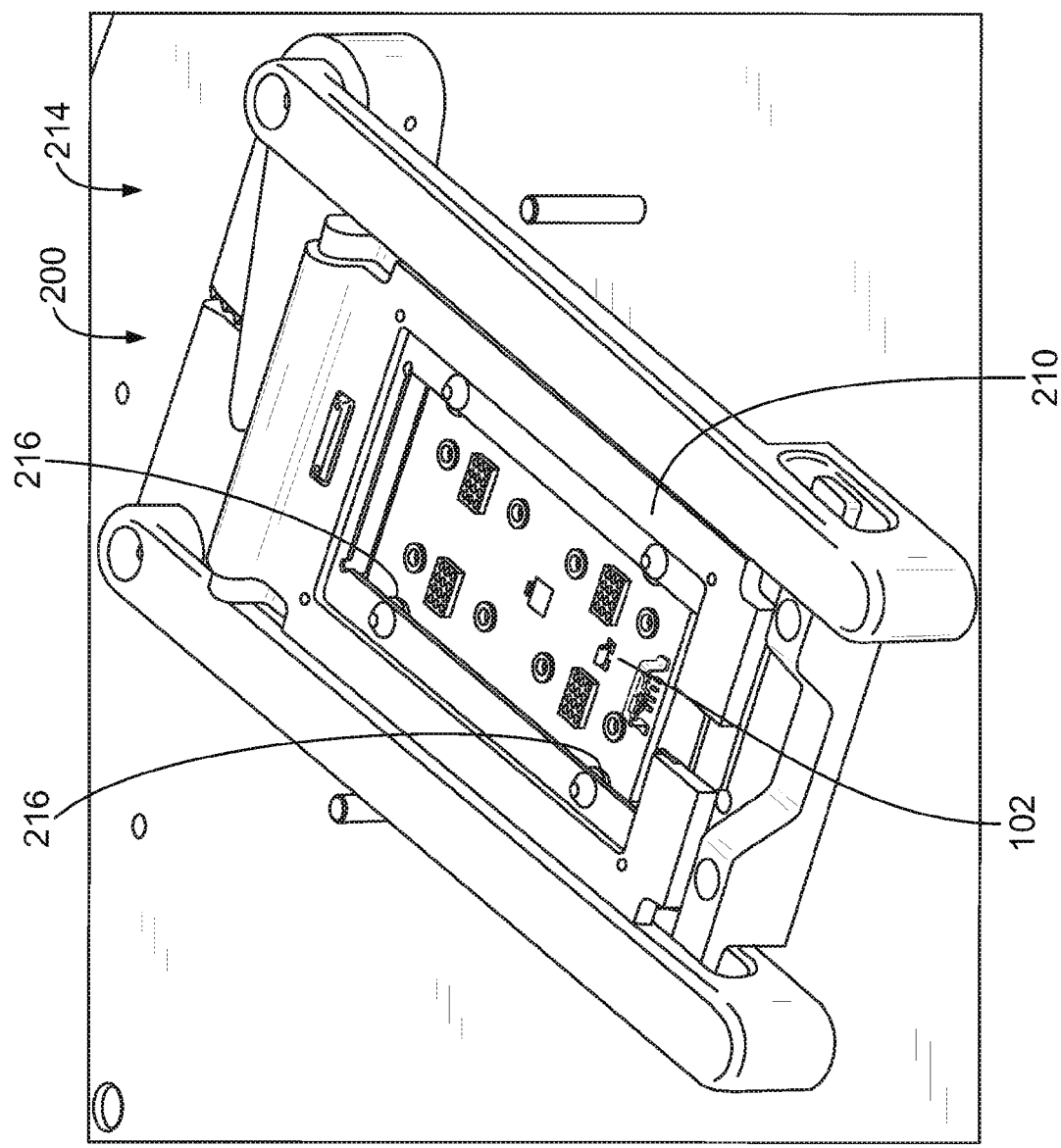
FIG. 7 is a top perspective view of the mounting module shown in FIG. 6 and in a closed position.

FIG. 7 is a top perspective view of the mounting module 200 shown in the closed position 214. The clamp 210 is moved so that the pads 216 are positioned against the LED board 102. The clamp 210 retains the LED board 102 on the mounting module 200. In an exemplary embodiment, the clamp 210 holds the LED board 102 against the thermal management system 204 (shown in FIG. 6) to enable heat transfer between the LED board 102 and the thermal management system 204. The clamp 210 is configured to substantially evenly distribute pressure against the LED board 102 to facilitate even heat transfer between the LED board 102 and the thermal management system 204.

FIG. 8 is a side perspective view of a LED verification system 300 formed in accordance with another embodiment. The system 300 includes a door 302 positioned at a base 304 of a hood 306. The hood 306 may be similar to the hood 112 illustrated in FIG. 1. A mounting module 308 is positioned on the door 302. The mounting module 308 is configured to retain a LED board, for example, the LED board 102 shown in FIG. 1, and may be at least any of the mounting modules described above. The mounting module 308 may be positioned on a cooling device (not shown) positioned on a side of the door 302 opposite the mounting module 308 and extending through the door 302. The door 302 is moveable along the arrow 314 between a closed position (not shown), wherein the LED board 102 is tested, and an open position 310 that enables access to the mounting module 308.

The door 302 may include a switch and/or a circuit 312 that provides power to the LED board 102, when the door is in the closed positioned. When the door 302 is in the open position 310, the switch and/or circuit 312 deactivates the power to the LED board 102 to protect an operator from potentially dangerous light.

The door 302 seals the hood 306 in the closed position to limit and/or prevent light from entering and/or escaping the hood 306. In the illustrated embodiment, the door 302 includes a seal 316 that facilitates sealing the hood 306. The seal 316 may be a gasket or the like.

FIG. 9 is a side perspective view of a hood 350 formed in accordance with another embodiment. The hood 350 includes an opening 358 and a door 352 that is moveable along the arrow 354 between an open position 356 and a closed position (not shown). When the door 352 is in the open position 356, the opening 358 provides access to a mounting module (not shown). In the closed position, the door 352 seals the hood 350 to limit and/or prevent light from entering or escaping the hood 350. The door 352 may include a gasket or the like to facilitate sealing the hood 350. In one embodiment, the door 352 may activate a switch and/or circuit, when in the closed position, to power an LED board (not shown) positioned within the hood 350.

Figure 11:
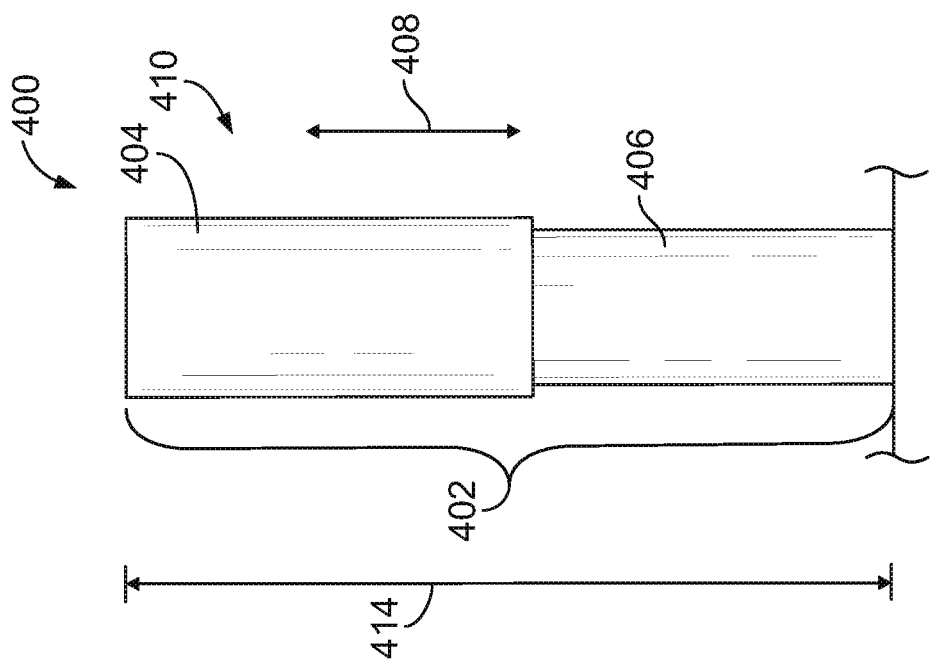
FIG. 11 is a side view of the LED verification system shown in FIG. 10 and in an extended position.
Figure 10:
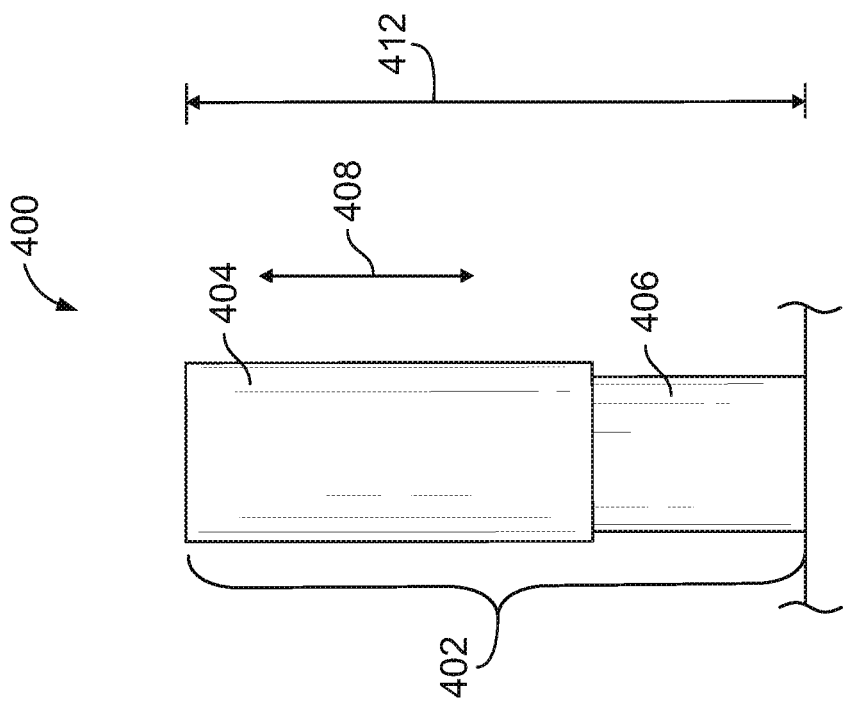
FIG. 10 is a side view of an LED verification system formed in accordance with another embodiment and in a retracted position.

FIG. 10 is a side view of an LED verification system 400 formed in accordance with another embodiment and in a retracted position 401. FIG. 11 is a side view of the system 400 and in an extended position 410. The system 400 includes a hood 402. In an exemplary embodiment, an accuracy of data related to the light parameters tested with the system 400 may vary with respect to a length of the hood 402. The hood 402 includes an upper portion 404 and a lower portion 406. The upper portion 404 is configured to move with respect to the lower portion 406 along the arrow 408. In the illustrated embodiment, the upper portion 404 slides over the lower portion 406. Alternatively, the upper portion 404 may slide within the lower portion 406. The upper portion 404 is moved between the retracted position 401 (shown in FIG. 10) and an extended position 410 (shown in FIG. 11) to adjust a length of the hood 402. For example, in FIG. 10, when in the retracted position 401, the hood 402 has a length (or height) 412. In FIG. 11, when in the extended position 410, the hood 402 has a length 414. The length 414 is greater than the length 412. In one embodiment, the upper portion 404 may be moved to any intermediate position between the retracted position 401 and the extended position 410.

In an exemplary embodiment, the upper portion 404 maintains a seal with the lower portion 406 to limit and/or prevent light from entering and/or escaping the hood 402. In one embodiment, at least one of the upper portion 404 or the lower portion 406 may include a seal, for example, a gasket to maintain the seal between the upper portion 404 and the lower portion 406.

The various embodiments provide a LED verification system that may be used in a manufacturing facility. The LED verification system requires relatively little room within the manufacturing facility. The LED verification system eliminates the need to send LED boards to a laboratory prior to use in the manufacturing facility. The LED verification system provides an inexpensive and time-saving means to test LED boards in the manufacturing facility.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A light emitting diode (LED) verification system comprising:
    a mounting module for securing an LED board for testing, wherein the mounting module comprises:
        a thermal management system for controlling a temperature of the LED board,
        a mounting plate for centering the LED board, and
        a clamp for securing the LED board;
    a hood defining a chamber positioned over the mounting module such that the mounting module and the LED board are contained within the chamber, the hood having a top and a base, the mounting module positioned at the base of the hood, the mounting plate centering the LED board with respect to a centerline of the hood; and
    a light meter positioned at the top of the hood and centered with respect to the centerline of the hood, the light meter measuring light emitted from the LED board.

2. The verification system of claim 1, wherein the thermal management system is positioned on a cooling device to control the temperature of the LED board.

3. The verification system of claim 1, wherein the hood seals light from entering or escaping the hood.

4. The verification system of claim 1, wherein the hood is cylindrical in shape.

5. The verification system of claim 1, wherein the clamp holds the LED board against the thermal management system to enable heat transfer between the LED board and the thermal management system.

6. The verification system of claim 1, wherein the light meter comprises a detector surface that extends parallel to a surface of the LED board.

7. The verification system of claim 1, wherein the mounting plate includes a mounting area sized for the LED board, the mounting plate interchangeable with other mounting plates having mounting areas sized for different LED boards.

8. The verification system of claim 1, wherein the hood includes an upper portion and a lower portion, the hood having an adjustable length by moving the upper portion with respect to the lower portion.

9. The verification system of claim 1, wherein the hood further comprises a door positioned at the base of the hood, the mounting module positioned on the door, the door moveable between a closed position, wherein the LED board is tested, and an open position that enables access to the mounting module.

10. The verification system of claim 1, wherein the hood has a door providing access to the chamber, the LED board being loaded into the mounting module through the door, the LED board being removed from the chamber through the door.

11. The verification system of claim 10, wherein the door is connected to a circuit that supplies power to the LED board when the door is in a closed position and blocks the power to the LED board when the door is in an open position.

12. A light emitting diode (LED) verification system comprising:
    a hood extending between a top and a base;
    a chamber defined by the hood, the chamber extending along a centerline between the top and the base; and
    a light meter positioned at the top, the light meter centered with respect to the centerline, wherein a LED board is positioned at the base and centered with respect to the centerline, the light meter configured to detect light emitted from the LED board.

13. The verification system of claim 12, wherein light is sealed from entering or escaping the hood.

14. The verification system of claim 12, wherein the hood is cylindrical in shape.

15. The verification system of claim 12, wherein the light meter comprises a detector surface that extends parallel to a surface of the LED board.

16. The verification system of claim 12, wherein the hood includes an upper portion and a lower portion, the hood having an adjustable length by moving the upper portion with respect to the lower portion.

17. A light emitting diode (LED) verification system comprising:
    a mounting module for securing a LED board for testing, wherein the mounting module comprises:
        a mounting plate for centering the LED board, and
        a clamp for securing the LED board;
    a hood defining a chamber positioned over the mounting module, the hood having a top and a base, the mounting module positioned at the base of the hood such that the LED board faces the top; and
    a light meter positioned at the top of the hood to measure light emitted from the LED board.

18. The verification system of claim 17, wherein the hood further comprises a door to enable access to the mounting module within the chamber, the LED board being loaded into the mounting module through the door, the LED board being removed from the chamber through the door.

19. The verification system of claim 17, wherein the light meter comprises a detector surface that extends parallel to a surface of the LED board.

20. The verification system of claim 17, wherein the mounting plate includes an mounting area sized for the LED board, the mounting plate interchangeable with other mounting plates having mounting areas sized for different LED boards.

* * * * *